United States Patent
Briggs et al.

(10) Patent No.: US 9,985,199 B1
(45) Date of Patent: May 29, 2018

(54) PREVENTION OF SWITCHING OF SPINS IN MAGNETIC TUNNEL JUNCTIONS BY ON-CHIP PARASITIC MAGNETIC SHIELD

(71) Applicant: International Business Machines Corporation, Armonk, NY (US)

(72) Inventors: Benjamin D. Briggs, Waterford, NY (US); Lawrence A. Clevenger, LaGrangeville, NY (US); Nicholas A. Lanzillo, Troy, NY (US); Michael Rizzolo, Albany, NY (US); Theodorus E. Standaert, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days. days.

(21) Appl. No.: 15/459,876

(22) Filed: Mar. 15, 2017

(51) Int. Cl.
| | |
|---|---|
| *H01L 43/02* | (2006.01) |
| *H01L 27/22* | (2006.01) |
| *H01L 43/08* | (2006.01) |
| *H01L 43/12* | (2006.01) |
| *H01L 23/58* | (2006.01) |
| *H01L 43/10* | (2006.01) |

(52) U.S. Cl.
CPC .............. *H01L 43/02* (2013.01); *H01L 23/58* (2013.01); *H01L 43/10* (2013.01); *H01L 43/12* (2013.01)

(58) Field of Classification Search
None
See application file for complete search history.

(56) References Cited

U.S. PATENT DOCUMENTS

| | | | |
|---|---|---|---|
| 5,902,690 | A | 5/1999 | Tracy et al. |
| 6,897,532 | B1 * | 5/2005 | Schwarz ............... B82Y 25/00 257/367 |
| 6,940,153 | B2 | 9/2005 | Spencer et al. |
| 6,977,401 | B2 | 12/2005 | Hosotani |
| 7,433,225 | B2 | 10/2008 | Worledge |
| 7,569,915 | B2 | 8/2009 | Spielberger et al. |
| 7,598,597 | B2 | 10/2009 | Guo et al. |

(Continued)

OTHER PUBLICATIONS

Iskandarova et al., "Micromagnetic modeling of the shielding properties of nanoscale ferromagnetic layers," Journal of Applied Physics 120, 123903 (Sep. 2016) (6 pages).

*Primary Examiner* — Khaja Ahmad
(74) *Attorney, Agent, or Firm* — Vazken Alexanian; Michael J. Chang, LLC

(57) ABSTRACT

Techniques for preventing switching of spins in a magnetic tunnel junction by stray magnetic fields using a thin film magnetic shield are provided. In one aspect, a method of forming a magnetic tunnel junction includes: forming a stack on a substrate, having a first magnetic layer, a tunnel barrier, and a second magnetic layer; etching the stack to partially pattern the magnetic tunnel junction in the stack, wherein the etching includes patterning the magnetic tunnel junction through the second magnetic layer, the tunnel barrier, and partway through the first magnetic layer; depositing a first spacer and a magnetic shield film onto the partially patterned magnetic tunnel junction; etching back the magnetic shield film and first spacer; complete etching of the magnetic tunnel junction through the first magnetic layer to form a fully patterned magnetic tunnel junction; and depositing a second spacer onto the fully patterned magnetic tunnel junction.

13 Claims, 5 Drawing Sheets

(56) References Cited

U.S. PATENT DOCUMENTS

| | | |
|---|---|---|
| 8,261,367 B2 | 9/2012 | Lenssen et al. |
| 8,415,775 B2 | 4/2013 | Katti |
| 8,557,610 B2 | 10/2013 | Chen et al. |
| 2007/0215911 A1 | 9/2007 | Torng et al. |
| 2009/0050992 A1 | 2/2009 | Kools et al. |
| 2011/0235217 A1* | 9/2011 | Chen .................. H01L 43/08 360/324.2 |
| 2015/0091109 A1 | 4/2015 | Allinger et al. |

* cited by examiner

US 9,985,199 B1

PREVENTION OF SWITCHING OF SPINS IN MAGNETIC TUNNEL JUNCTIONS BY ON-CHIP PARASITIC MAGNETIC SHIELD

FIELD OF THE INVENTION

The present invention relates to magnetic tunnel junctions, and more particularly, to techniques for preventing switching of spins in a magnetic tunnel junction by on-chip parasitic magnetic fields using a thin film magnetic shield around the magnetic tunnel junction to isolate the device from stray magnetic fields.

BACKGROUND OF THE INVENTION

Magnetic tunnel junctions store data based on an orientation of a free (switchable) magnetic layer(s) relative to a fixed (reference) magnetic layer(s) that are separated from one another by a tunnel barrier. Having the free magnetic layer oriented parallel to the fixed magnetic layer represents one data value, while having the free magnetic layer oriented anti-parallel to the fixed magnetic layer represents another data value, for instance a logic "1" and a logic "0," or vice versa. The orientation of the free magnetic layer can be switched between these two data states.

Stray on-chip magnetic fields can randomly switch the electron spin in magnetic tunnel junctions or skew the probability of switching. Some examples of sources of these stray on-chip magnetic fields include on-chip inductors and cobalt (Co) liners used for back-end-of-line (BEOL) metallization. Such factors are undesirable as they affect the switching accuracy of magnetic tunnel junction devices.

Therefore, improved magnetic tunnel junction devices that are resistant to stray on-chip magnetic fields would be desirable.

SUMMARY OF THE INVENTION

The present invention provides techniques for preventing switching of spins in a magnetic tunnel junction by on-chip parasitic magnetic fields using a thin film magnetic shield around the magnetic tunnel junction to isolate the device from stray magnetic fields. In one aspect of the invention, a method of forming a magnetic tunnel junction is provided. The method includes the steps of: forming a stack of magnetic tunnel junction layers on a substrate, the stack including a first magnetic layer, a tunnel barrier disposed on the first magnetic layer, and a second magnetic layer disposed on the tunnel barrier; etching the stack to partially pattern the magnetic tunnel junction in the stack, wherein the etching includes patterning the magnetic tunnel junction through the second magnetic layer, the tunnel barrier, and partway through the first magnetic layer; depositing a first spacer onto the partially patterned magnetic tunnel junction; depositing a magnetic shield film onto the first spacer; etching back the magnetic shield film and the first spacer to remove the magnetic shield film and the first spacer from horizontal surfaces of the magnetic tunnel junction; complete etching of the magnetic tunnel junction through the first magnetic layer to form a fully patterned magnetic tunnel junction; and depositing a second spacer onto the fully patterned magnetic tunnel junction.

In another aspect of the invention, a magnetic tunnel junction is provided. The magnetic tunnel junction includes: a substrate; a first magnetic layer disposed on the substrate; a tunnel barrier disposed on the first magnetic layer; a second magnetic layer disposed on the tunnel barrier; a first spacer surrounding the second magnetic layer, the tunnel barrier and at least a portion of the first magnetic layer; a magnetic shield film surrounding the first spacer; and a second spacer surrounding the magnetic shield film and fully covering the first magnetic layer, the tunnel barrier, and the second magnetic layer.

A more complete understanding of the present invention, as well as further features and advantages of the present invention, will be obtained by reference to the following detailed description and drawings.

DETAILED DESCRIPTION OF PREFERRED EMBODIMENTS

As provided above, on-chip parasitic magnetic fields can undesirably affect the switching behavior of magnetic tunnel junctions. Advantageously, provided herein are techniques for isolating magnetic tunnel junctions from stray on-chip magnetic fields using a thin film magnetic shield surrounding the magnetic tunnel junction. As will be described in detail below, the present magnetic shield is formed from a thin (e.g., from about 1 nanometer (nm) to about 30 nm, and ranges therebetween) magnetic material such as cobalt (Co), nickel (Ni), iron (Fe), and combinations thereof, such as alloys like nickel-iron NiFe.

Figure 1:
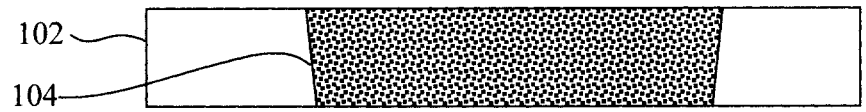
FIG. 1 is a cross-sectional diagram illustrating at least one bottom electrode having been formed in a dielectric substrate according to an embodiment of the present invention.

An exemplary methodology for forming the present magnetic tunnel junction is now described by way of reference to FIGS. 1-10. As shown in FIG. 1, the process begins with a substrate 102 in which at least one bottom electrode 104 is formed. Suitable materials for substrate 102 include, but are not limited to, dielectrics such as silicon oxide ($SiO_2$). To form the bottom electrode 104 in substrate 102, a trench is first patterned in the substrate and then filled with an electrically conductive material such as a metal or a metal nitride. Suitable electrode metals include, but are not limited to, titanium (Ti) and/or tantalum (Ta). Suitable metal nitrides include, but are not limited to, titanium nitride (TiN) and/or tantalum nitride (TaN). Any metal overfill can be removed using a process such as chemical-mechanical polishing or CMP. As a result, the top surface of the bottom electrode 104 is coplanar with the top surface of the substrate 102. See FIG. 1.

Next, a stack of layers making up the magnetic tunnel junction is deposited, one layer on top the other, onto the substrate 102 over the bottom electrode 104. See FIG. 2. In general, a magnetic tunnel junction includes at least one free (switchable) magnetic layer and at least one fixed (reference) magnetic layer separated by a tunnel barrier.

Figure 2:
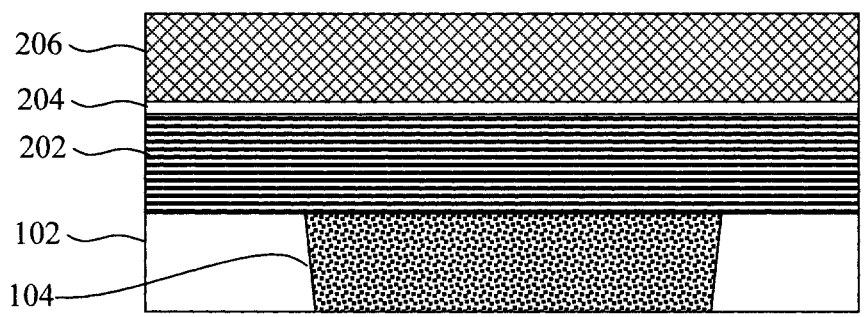
FIG. 2 is a cross-sectional diagram illustrating a first magnetic layer having been deposited onto the substrate over the bottom electrode, a tunnel barrier having been deposited onto the first magnetic layer, and a second magnetic layer having been deposited onto the tunnel barrier according to an embodiment of the present invention.

As shown in FIG. 2, a first magnetic layer 202 (the fixed magnetic layer) is deposited directly onto the substrate 102 and bottom electrode 104. A tunnel barrier 204 is deposited onto the first magnetic layer 202. A second magnetic layer 206 (the free magnetic layer) is deposited onto the tunnel barrier 204. As such, the tunnel barrier 204 separates the first magnetic layer 202 from the second magnetic layer 206, i.e., the fixed magnetic layer from the free magnetic layer, respectively.

According to an exemplary embodiment, the first magnetic layer 202 and the second magnetic layer 206 are each formed from the same or different ferromagnetic material selected from Co, Ni, Fe, and combinations thereof, such as alloys like NiFe. The tunnel barrier 204 is formed from aluminum oxide (AlOx) and/or magnesium oxide (MgO). The first and second magnetic layers 202/206 and the tunnel barrier 204 can be deposited sequentially using a process such as sputtering or molecular beam epitaxy (MBE).

It is notable that, while the drawings illustrate the first and second magnetic layers 202/206 each as single layers, this is done merely for ease and clarity of depiction. Embodiments are anticipated herein where multi-layer magnetic layers are employed. See, for example, U.S. Pat. No. 7,433,225 issued to Daniel C. Worledge, entitled "Scalable Magnetic Random Access Memory Device" (hereinafter "U.S. Pat. No. 7,433,225"), the contents of which are incorporated by reference as if fully set forth herein. For instance, as provided in U.S. Pat. No. 7,433,225, the fixed magnetic layer can include multiple (anti-parallel-coupled) magnetic layers each containing Ni, Fe and/or Co.

The next task is to pattern the stack of the first and second magnetic layers 202/206 and the tunnel barrier 204 into one or more individual magnetic tunnel junctions. To do so, a patterned hardmask is formed on the stack over the bottom electrode 104 marking the footprint and location of at least one magnetic tunnel junction. See FIG. 3.

Figure 3:
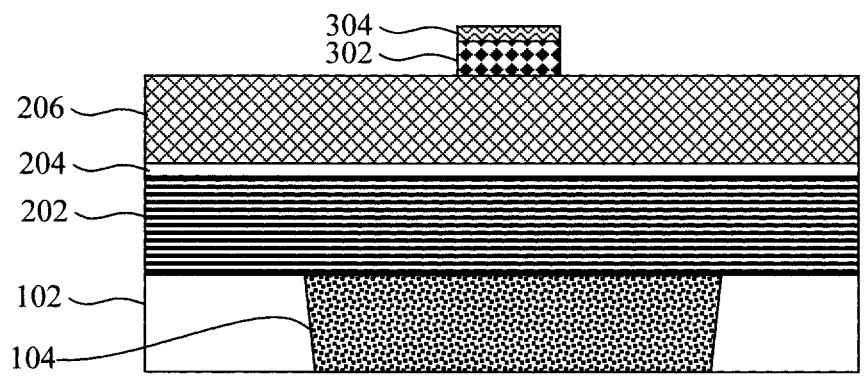
FIG. 3 is a cross-sectional diagram illustrating a patterned hardmask having been formed on the stack over the bottom electrode marking a footprint and location of at least one magnetic tunnel junction according to an embodiment of the present invention.

In the example depicted in FIG. 3, the hardmask includes a dual layer hardmask 302/304. According to an exemplary embodiment, the dual layer hardmask includes a Ta/TaN bilayer, where the hardmask layer 302 includes Ta and is disposed onto the second magnetic layer 206, and the hardmask layer 304 includes TaN and is disposed on the hardmask layer 302. A bilayer Ta/TaN hardmask is described, for example, in U.S. Patent Application Publication Number 2007/0215911 by Torng et al., entitled "Magnetic Tunnel Junction Patterning Using Ta/TaN as hard mask," the contents of which are incorporated by reference as if fully set forth herein.

The hardmask is then used to pattern the stack. However at this stage in the process, only a partial etch is performed whereby the magnetic tunnel junction is patterned down through the second magnetic layer 206, the tunnel barrier 204, and only partway through the first magnetic layer 202. See FIG. 4. The stack will be completed later in the process, after the thin film magnetic shield has been formed around the (partially patterned) magnetic tunnel junction. See below.

Figure 4:
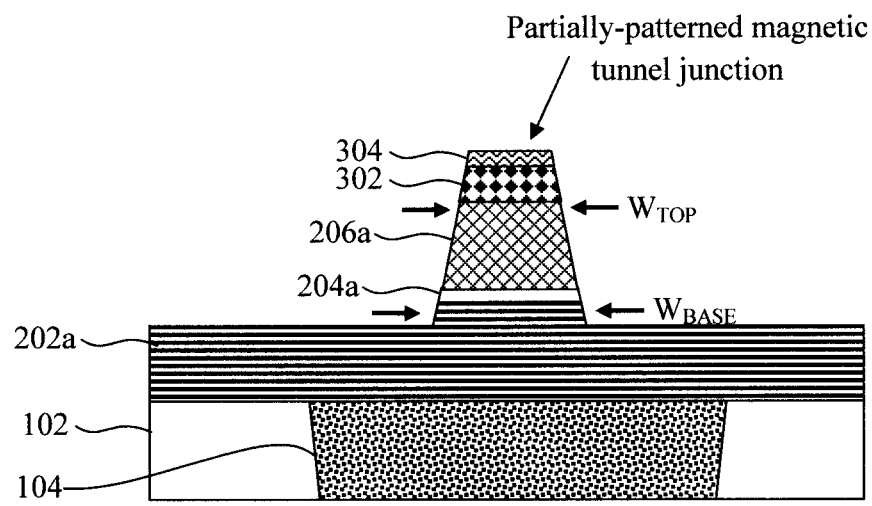
FIG. 4 is a cross-sectional diagram illustrating a partial etch having been performed to pattern the stack partway through the first magnetic layer according to an embodiment of the present invention.
Figure 5:
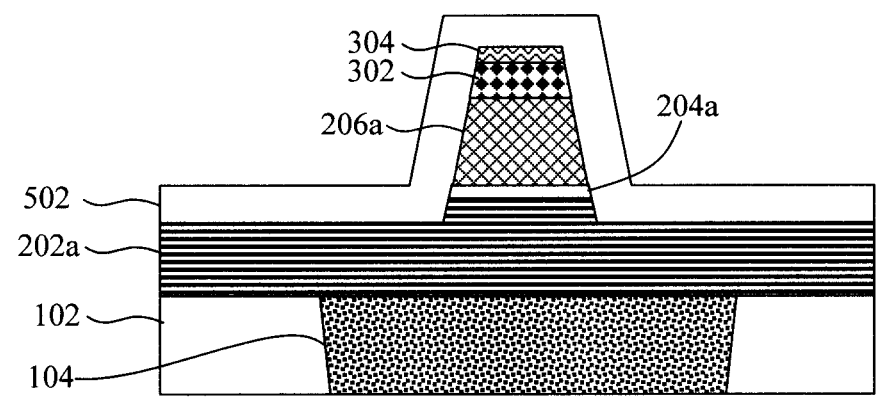
FIG. 5 is a cross-sectional diagram illustrating a first spacer having been deposited onto and fully encapsulating the (partially patterned) magnetic tunnel junction according to an embodiment of the present invention.

Specifically, as shown in FIG. 4 the etch is endpointed after the tunnel barrier 204 when only a portion of the first magnetic layer 202 has been removed. As a result, a portion of the (partially etched) first magnetic layer 202 remains covering the substrate 102 and bottom electrode 104. Suitable etching techniques include, but are not limited to, ion beam etching (IBE).

Post-patterning, the first magnetic layer 202, the tunnel barrier 204, and the second magnetic layer 206 are given the reference numerals 202a, 204a, and 206a, respectively. It is also notable that the etch may produce a tapered profile of the magnetic tunnel junction. See, for example, FIG. 4 which illustrates that the magnetic tunnel junction, as patterned, may end up being wider at its base (i.e., width $W_{BASE}$) than at its top (i.e., width $W_{TOP}$), e.g., $W_{BASE} > W_{TOP}$. As will be described in detail below, due to the unique nature of the process, the base of the completed magnetic tunnel junction will end up being even wider at the bottom.

A first spacer 502 is next deposited onto and fully encapsulating the (partially patterned) magnetic tunnel junction. See FIG. 5. According to an exemplary embodiment, the first spacer 502 is formed from a dielectric material including, but not limited to, a silicon-based oxide or nitride such as silicon nitride (SiN) and/or silicon oxide ($SiO_2$) which is deposited using a conformal deposition process such as physical vapor deposition (PVD), chemical vapor deposition (CVD) or atomic layer deposition (ALD). Preferably, the first spacer 502 is deposited at a low temperature in order to prevent degradation of the magnetic tunnel junction during the encapsulation step, likely due to diffusion of metallic species across the tunnel barrier. By "low" it is meant herein that temperatures during deposition of the first spacer 502 do not exceed 250° C. For instance, a low temperature PVD, ALD or CVD process can be employed to deposit the first spacer 502 at a temperature of from about 20° C. to about 250° C., and ranges therebetween.

Figure 6:
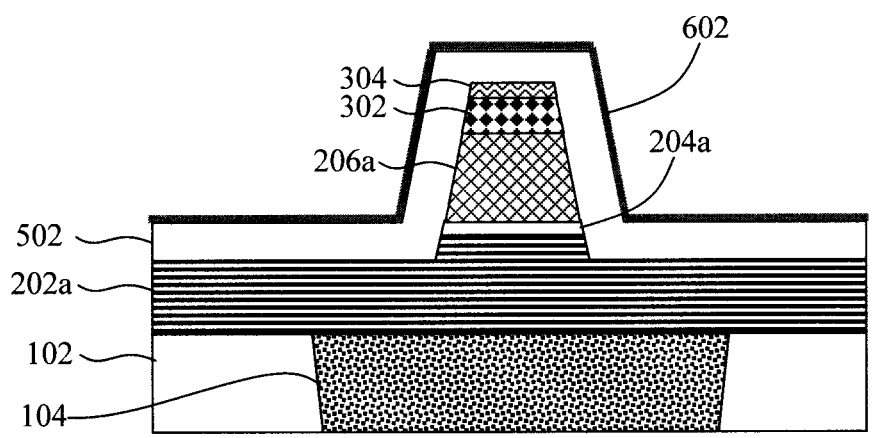
FIG. 6 is a cross-sectional diagram illustrating a thin film magnetic shield having been deposited onto the first spacer according to an embodiment of the present invention.

A thin film magnetic shield 602 is next deposited onto the first spacer 502. See FIG. 6. As provided above, the magnetic shield 602 may be formed from a ferromagnetic material such as Co, Ni, Fe, and combinations thereof, such as alloys like NiFe. Suitable deposition processes for these magnetic materials include, but are not limited, sputtering and evaporation. Preferably, the magnetic shield 602 is formed having a thickness of from about 1 nm to about 30 nm and ranges therebetween, e.g., from about 5 nm to about 10 nm and ranges therebetween. As shown in FIG. 6, the magnetic shield 602 as deposited is a conformal layer or film fully covering the first spacer 502.

During operation, the magnetic shield 602 will prevent stray magnetic fields from affecting the magnetic tunnel junction, thus effectively isolating the magnetic tunnel junction from these fields. Without the unwanted influence of these external magnetic fields, the switching behavior of the magnetic tunnel junction will be more consistent and reliable. The general shielding properties of ferromagnetic materials for shielding field lines is discussed, for example, in Iskandarova et al., "Micromagnetic modeling of the shielding properties of nanoscale ferromagnetic layers," Journal of Applied Physics 120, 123903 (September 2016) (6 pages), the contents of which are incorporated by reference as if fully set forth herein.

Figure 7:
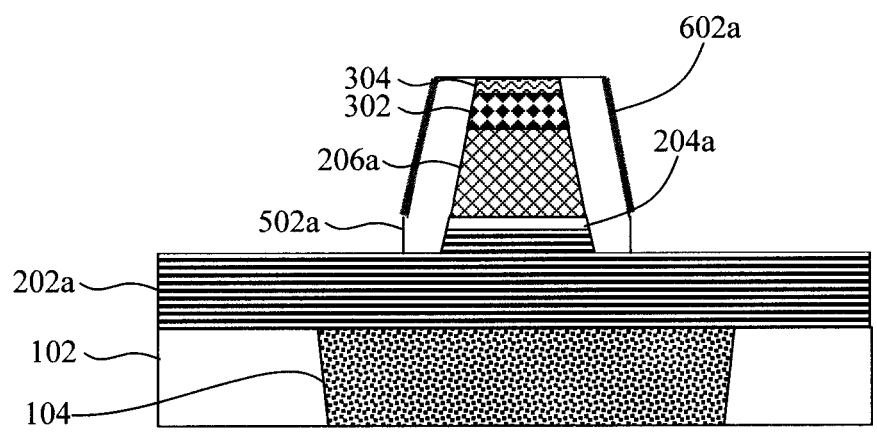
FIG. 7 is a cross-sectional diagram illustrating an anisotropic etch having been used to etch back the magnetic shield and the first spacer according to an embodiment of the present invention.

An anisotropic etch is then used to etch back the magnetic shield 602 and the first spacer 502. See FIG. 7. The magnetic shield 602 and first spacer 502 post-etch back are given reference numerals 602a and 502a, respectively. As shown in FIG. 7, this directional etch back effectively removes the magnetic shield 602 and first spacer 502 from horizontal surfaces, such that the etched magnetic shield 602a and first spacer 502a remain only on vertical surfaces. Suitable anisotropic-directional etching processes include, but are not limited to, reactive ion etching or RIE. The purpose of etching back the magnetic shield 602 and the first spacer 502 is that the magnetic shield 602 should be kept surrounding the free magnetic layer (i.e., magnetic layer 206a), but electrically isolated and magnetically de-coupled from the fixed magnetic layer (i.e., magnetic layer 202a). Also, the etch back will prevent the magnetic shield 602 from inadvertently and undesirably shorting to the bottom electrode 104.

Following etch back of the magnetic shield 602 and the first spacer 502, the patterning of the magnetic tunnel junction through the first magnetic layer 202a is then completed. See FIG. 8. As above, ion beam etching or IBE is suitable for patterning the magnetic layer 202a.

Figure 8:
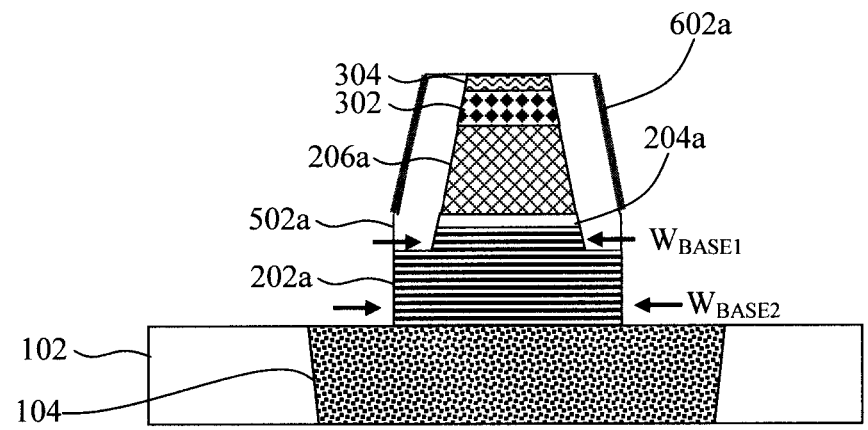
FIG. 8 is a cross-sectional diagram illustrating the patterning of the magnetic tunnel junction through the first magnetic layer having been completed according to an embodiment of the present invention.

This completes the patterning of the magnetic tunnel junction which is now fully formed through the first magnetic layer 202a, down to the bottom electrode 104. As shown in FIG. 8, due to this unique process the base of the completed magnetic tunnel junction ends up being even wider at the bottom. Namely, due to the partial etch followed by first spacer and magnetic shield deposition and etch back, the first magnetic layer 202a at the base of the magnetic tunnel junction is actually wider at its bottom (width $W_{BASE2}$) than it is at its top (width $W_{BASE1}$, i.e., $W_{BASE2}$ > $W_{BASE1}$. See FIG. 8.

Figure 9:
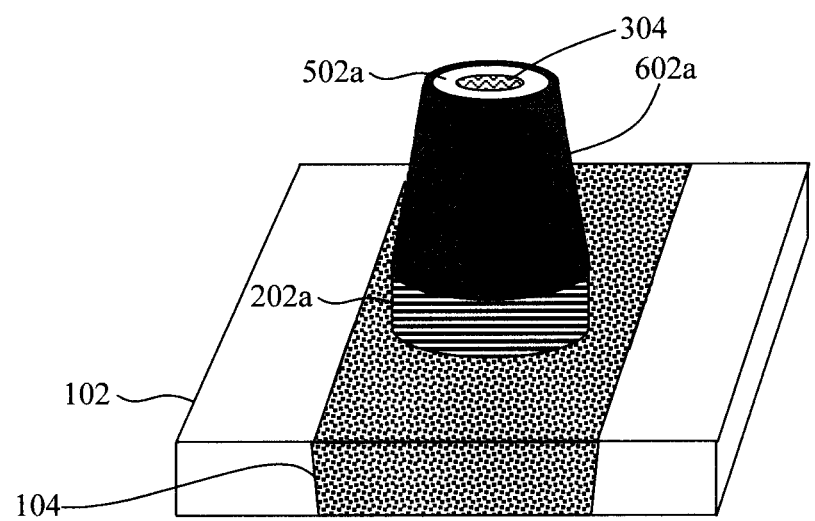
FIG. 9 is a three-dimensional diagram illustrating the magnetic tunnel junction, first spacer, and magnetic shield according to an embodiment of the present invention.

It is notable that the magnetic shield 602a forms an isolation barrier completely surrounding the magnetic tunnel junction. See FIG. 9. Further, as shown in FIG. 9, due to the tapered shape of the patterned magnetic tunnel junction (see above), the magnetic shield 602a too will have a tapered shape. FIG. 9 provides a three-dimensional depiction of the magnetic tunnel junction, first spacer, and magnetic shield.

A second spacer 1002 is then deposited onto and fully encapsulating the (now fully patterned) magnetic tunnel junction. See FIG. 10. According to an exemplary embodiment, the second spacer 1002 is formed from a dielectric material such as SiN and/or or $SiO_2$ which is deposited using a conformal deposition process such as PVD, CVD or ALD. While depicted in cross-section in FIG. 10, the second spacer 1002 (like the first spacer and the magnetic shield) also fully surrounds the magnetic tunnel junction. High temperatures are now allowed during deposition of the second spacer 1002 because the tunnel barrier has been passivated by a low-temperature encapsulation layer (i.e., the first spacer 502—see above), preventing degradation. The first spacer 502 prevents shorting across the tunnel barrier, while the second spacer 1002 helps ensure hermeticity like a dielectric cap layer would for metallization levels. By "high" it is meant herein that temperatures during deposition of the second spacer 1002 can exceed 250° C. For instance, a PVD, ALD or CVD process can be employed to deposit the second spacer 1002 at a temperature of from about 250° C. to about 400° C., and ranges therebetween.

Figure 10:
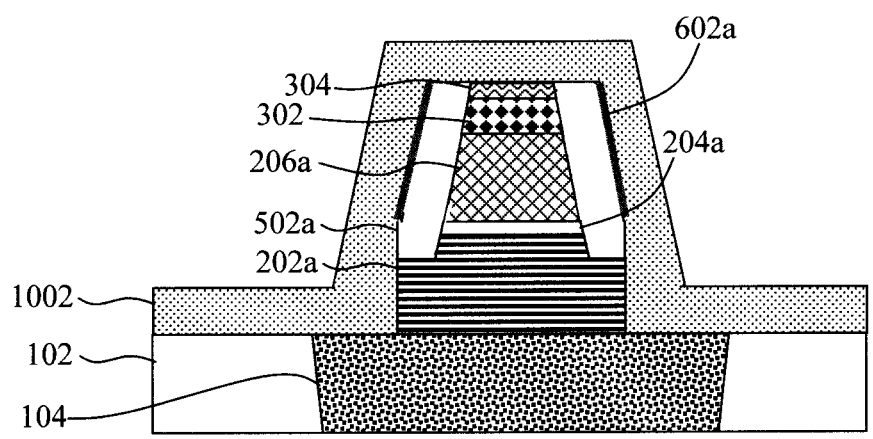
FIG. 10 is a cross-sectional diagram illustrating a second spacer having been deposited onto and fully encapsulating the (now fully patterned) magnetic tunnel junction according to an embodiment of the present invention.

As shown in FIG. 10, the magnetic tunnel junction includes the first magnetic layer 202a, the tunnel barrier 204a, and the second magnetic layer 206a disposed one on top of the other on the substrate 102 over the bottom electrode 104. As patterned, the first spacer 502a and magnetic shield 602a both surround the second magnetic layer 206a, the tunnel barrier 204a and at least a portion of the first magnetic layer 202a (since the etch of the first magnetic layer 202a is completed after deposition and etch back of the first spacer and magnetic shield). The second spacer, on the other hand, fully covers the first magnetic layer 202a, the tunnel barrier 204a, and the second magnetic layer 206a.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming a magnetic tunnel junction, comprising the steps of:
    forming a stack of magnetic tunnel junction layers on a substrate, the stack comprising a first magnetic layer, a tunnel barrier disposed on the first magnetic layer, and a second magnetic layer disposed on the tunnel barrier;
    etching the stack to partially pattern the magnetic tunnel junction in the stack, wherein the etching comprises patterning the magnetic tunnel junction through the second magnetic layer, the tunnel barrier, and partway through the first magnetic layer;
    depositing a first spacer onto the partially patterned magnetic tunnel junction;
    depositing a magnetic shield film onto the first spacer;
    etching back the magnetic shield film and the first spacer to remove the magnetic shield film and the first spacer from horizontal surfaces of the magnetic tunnel junction;
    complete etching of the magnetic tunnel junction through the first magnetic layer to form a fully patterned magnetic tunnel junction; and
    depositing a second spacer onto the fully patterned magnetic tunnel junction.

2. The method of claim 1, wherein the magnetic shield film comprises a ferromagnetic material selected from the group consisting of: cobalt (Co), nickel (Ni), iron (Fe), and combinations thereof.

3. The method of claim 1, wherein the magnetic shield film comprises a nickel-iron (NiFe) alloy.

4. The method of claim 1, wherein the magnetic shield film has a thickness of from about 1 nm to about 30 nm, and ranges therebetween.

5. The method of claim 1, wherein the magnetic shield film has a thickness of from about 5 nm to about 10 nm, and ranges therebetween.

6. The method of claim 1, wherein the first magnetic layer and the second magnetic layer are each formed from a ferromagnetic material selected from the group consisting of: Co, Ni, Fe, and combinations thereof.

7. The method of claim 1, wherein the tunnel barrier is formed from a material selected from the group consisting of: aluminum oxide (AlOx), magnesium oxide (MgO), and combinations thereof.

8. The method of claim 1, further comprising the steps of:
   forming at least one bottom electrode in the substrate; and
   forming the stack of the magnetic tunnel junction layers on the substrate over the bottom electrode.

9. The method of claim 8, wherein a top surface of the bottom electrode is coplanar with a top surface of the substrate.

10. The method of claim 1, wherein the substrate comprises a dielectric.

11. The method of claim 1, further comprising the step of:
   forming a patterned hardmask on the stack marking the footprint and location of the magnetic tunnel junction.

12. The method of claim 1, wherein the first spacer and the second spacer are each formed from a material selected from the group consisting of silicon nitride, silicon oxide, and combinations thereof.

13. The method of claim 1, wherein the first spacer is deposited at a temperature of from about 20° C. to about 250° C. and ranges therebetween, and wherein the second spacer is deposited at a temperature of from about 250° C. to about 400° C. and ranges therebetween.

* * * * *